United States Patent
Pierschel

(10) Patent No.: US 8,823,124 B2
(45) Date of Patent: Sep. 2, 2014

(54) SEMICONDUCTOR STRUCTURE FOR A RADIATION DETECTOR AND A RADIATION DETECTOR

(71) Applicant: First Sensor AG, Berlin (DE)

(72) Inventor: Michael Pierschel, Berlin (DE)

(73) Assignee: First Sensor AG (DE)

( * ) Notice: Subject to any disclaimer, the term of this patent is extended or adjusted under 35 U.S.C. 154(b) by 0 days.

(21) Appl. No.: 13/765,710

(22) Filed: Feb. 13, 2013

(65) Prior Publication Data

US 2013/0207216 A1 Aug. 15, 2013

(30) Foreign Application Priority Data

Feb. 15, 2012 (DE) .......................... 10 2012 101 224
Apr. 26, 2012 (DE) .......................... 10 2012 103 699

(51) Int. Cl.
- *H01L 31/0352* (2006.01)
- *H01L 27/144* (2006.01)
- *H01L 31/107* (2006.01)

(52) U.S. Cl.
CPC .... *H01L 31/035272* (2013.01); *H01L 27/1446* (2013.01); *H01L 31/107* (2013.01)
USPC ..... 257/438; 257/428; 257/431; 257/E31.087

(58) Field of Classification Search
USPC ........................... 257/438, 428, 431, E31.087
See application file for complete search history.

(56) References Cited

U.S. PATENT DOCUMENTS

| 5,859,446 A | 1/1999 | Nagasu et al. |
| 2010/0213565 A1* | 8/2010 | Bui et al. ...................... 257/447 |
| 2011/0198615 A1* | 8/2011 | Shushakov et al. ............. 257/77 |
| 2013/0099091 A1* | 4/2013 | Nemirovsky et al. ......... 250/206 |

FOREIGN PATENT DOCUMENTS

DE     690 11 809 T2     3/1995

* cited by examiner

*Primary Examiner* — Mamadou Diallo
(74) *Attorney, Agent, or Firm* — Schmeiser, Olsen & Watts LLP

(57) ABSTRACT

A semiconductor structure for a radiation detector, comprising a substrate composed of a semiconductor material of a first conductivity type, a semiconductor substrate, wherein the semiconductor substrate is provided with a semiconductor layer provided on the substrate and having a higher resistance in comparison to the substrate, of the first conductivity type, and electrically doped with a doping concentration, a plurality of doped regions, wherein the plurality of doped regions are provided in the semiconductor substrate and separated from each other, of a second conductivity type that is opposite from the first conductivity type, and electrically doped with a doping concentration that is higher than the doping concentration in the semiconductor substrate, at least one further doping region, and a cover layer is provided.

12 Claims, 8 Drawing Sheets

SEMICONDUCTOR STRUCTURE FOR A RADIATION DETECTOR AND A RADIATION DETECTOR

FIELD OF TECHNOLOGY

The present disclosure relates to technologies in the field of semiconductor radiation detectors, in particular avalanche phototransistors.

BACKGROUND

Semiconductor detectors with signal amplification by means of the avalanche effect are often used in radiation receivers for single photon detection.

On the one hand, constructions in use today require a mechanism to keep the field strength above the breakthrough field strength for purposes of single photon detection, the so-called Geiger mode. On the other hand, it should be possible after detection to decrease the breakthrough field so as to be able to detect rapidly following additional photons, so-called "quenching".

There here exist passive strategies with resistors or semiconductor circuits located outside the semiconductor, and variants actively integrated into the semiconductor, which all have different advantages and disadvantages.

Efforts have been underway for several years to monolithically integrate this quenching ("quenching"). This offers both advantages with respect to the so-called fill factor, which describes the utilization of the semiconductor surface of the detector that faces the radiation, as well as time advantages, wherein dead times that cannot be used for detection purposes are diminished.

One of these solutions provides for a way to combine the avalanche effect and "quenching" into a monolithic structure. The main disadvantage to this solution is that rather low-resistance semiconductor layers must be used to ensure reliable function and find a suitable operating point. In addition, the geometric dimensions and layer thickness of the semiconductor substrate must be precisely adjusted, since the functional limitations associated with the low resistance here yield quite a narrow technological window. In the typical, unavoidable fluctuations in epitaxial layer thickness from the center to edge of a wafer, this leads to significant losses in yield.

In addition, the fact that a low-resistance substrate material was used directly implies a limitation of function to rather small pixel geometries. This essentially is because only small layer thicknesses can be depleted in low-resistance substrates, after which the breakthrough field strengths are reached rather quickly. The large capacities of the "floating" structures directly associated therewith greatly limit the potential swing required for function. This makes it harder to find a suitable operating point for such structures.

In addition, the limitation to very small pixels combined with the density required for the latter to ensure good quantum yield makes so-called "afterpulsing" into a major problem. In each microplasma of an avalanche process, the highly energy-laden, moving charge carriers cause individual radiating photons to spontaneously arise. These photons can radiate in all spatial directions within the semiconductor crystal. The composition of this radiation spectrum is such that these individual photons can radiate on average about 7 micrometers to 8 micrometers until being absorbed in the crystal. If only structures with a pixel geometry of up to roughly 4 micrometers can be realized with the low-resistance substrates, and the gap regions between two pixels are designed to be rather small, so as to achieve good quantum yield, triggering directly adjacent pixels becomes a major problem in such structures, since these kinds of phenomena disrupt the actual measurements. If the gap regions are enlarged, the quantum yield drops dramatically. This design dilemma is directly associated with the use of low-resistance semiconductor layers.

Document DE 690 11809 T2 discloses a semiconductor configuration with a semiconductor body having a first configuration area with a first conductivity type, which together with a second configuration area with a second conductivity type opposite the first, which is provided next to one of the main surfaces of the semiconductor body, forms a first pn-transition, which is reverse-biased in at least one operating mode of the configuration. An open additional region with the second conductivity type is provided, which is supplied within the first configuration area remotely from the main surfaces of the semiconductor body and spaced apart from the second configuration area, so that in one operating mode of the configuration, the depletion region of the first pn-transition reaches the open additional region prior to the breakthrough of the first pn-transition. The additional region forms another pn-transition with a highly doped separating region with a first conductivity type, which is supplied within the first configuration area between the open additional region and the second configuration area and spaced apart from the second configuration.

Known from Document DE 697 21 366 T2 are a diode as well as a converter circuit device. The diode is composed of a first semiconductor layer of a first conduction type, a second semiconductor layer of a second conduction type provided in the first semiconductor layer, a first main electrode electrically connected with the first semiconductor layer, as well as a second main electrode, which contacts the first semiconductor layer in a contact region within an edge portion of a transition area between the first and second semiconductor layer, wherein the edge portion lies on the edge of the second semiconductor region. The shortest lateral distance between the contact region and edge portion of the transition is not shorter than the diffusion length of minority charge carriers in the first semiconductor layer.

SUMMARY

A semiconductor structure for a radiation detector, as well as a radiation detector based hereon, which avoid the disadvantages in prior art is provided. In particular, to enable the manufacture of larger pixel structures for the radiation detector with a better quantum yield, as well as the reduction in so-called "afterpulsing" over larger gap regions. In addition, to support a more precise manufacturing of the operating point and yield.

A first aspect relates to a semiconductor structure for a radiation detector based on the independent claim 1. Further provided is a radiation detector based on the independent claim 12.

Provided is a semiconductor structure for a radiation detector, the semiconductor structure comprising a substrate composed of a semiconductor material of a first conductivity type, and a semiconductor substrate formed hereon with a semiconductor layer, wherein the semiconductor layer is provided with a higher resistance in comparison to the substrate. The semiconductor layer is also of the first conductivity type. The semiconductor material of the semiconductor layer is electrically doped with a doping concentration. The semiconductor substrate may be provided with an essentially identical electrical conductivity in comparison to the substrate. Doping regions are formed in the semiconductor substrate, buried therein and separated (isolated) from each other. The doping regions exhibit a second conductivity type that is opposite from the first conductivity type. The doping regions are electrically doped with a doping concentration that is higher than the doping concentration in the semiconductor substrate. At least one additional doping region is provided in the semiconductor substrate, and also buried herein. The at least one additional doping region is of the first conductivity type, and allocated (assigned) to one or more of the doping regions. Furthermore, the at least one additional doping region is electrically doped with a doping concentration that is higher than the doping concentration in the semiconductor substrate. Finally, the semiconductor structure has a cover layer that is provided on the semiconductor substrate and of the second conductivity type.

A radiation detector, in particular an avalanche detector, such as an avalanche phototransistor, is provided with such a semiconductor structure.

When used in the radiation detector, the semiconductor structure is always reverse-biased.

In the semiconductor structure, the doping regions are buried in the semiconductor substrate formed on the substrate, meaning that they exhibit a continuous distance to the edges of the semiconductor substrate. They are isolated or separate from each other. The doping regions preferably form a planar configuration of doping zones extending in a plane in the semiconductor substrate. In this way, a pixel configuration extending in the surface area can be fabricated in the semiconductor structure. The planar configuration of the doping regions extends in the surface area of the semiconductor substrate.

Also provided now is at least one additional doping region, which itself preferably also extends in the surface area of the semiconductor substrate, and is allocated to one or more of the doping regions, which preferably means that, as revealed in a top view of the surface area in which the semiconductor substrate extends, the at least one additional doping region at least partially flatly overlaps the one or more allocated doping regions. When the semiconductor structure is used in the radiation detector, this implies a planar overlap in the viewing direction on the photoactive region (sensor surface) of the detector.

The semiconductor substrate is provided with an electric doping concentration that forms a weak electric doping in such a way as to give the semiconductor substrate a high resistance in comparison to the substrate, whereas the substrate is designed with a low resistance. By contrast, the doping regions exhibit a doping concentration that is sufficient to prevent the depletion of charge carriers during operation. Therefore, the charge carriers in the doping regions do not become depleted during operation.

Formed in the area of the semiconductor substrate between the doping regions and the cover layer is an avalanche area, i.e., an area of high electrical field strength (high field), in which free charge carriers are reproduced when using the semiconductor structure in the radiation detector due to collisions (avalanche effect). The quench area is established in the area between the doping regions and the substrate in the semiconductor substrate.

The cover layer arranged on the semiconductor substrate is fabricated with a conductivity type opposite the conductivity type of the underlying semiconductor substrate. This yields a pn-transition between the cover layer and the semiconductor substrate, which acts as a top diode during operation when the semiconductor structure is used in the radiation detector.

In comparison to prior art, it is here proposed that a high-resistance semiconductor substrate be used in place of the low-resistance one. In order to produce the high resistance, the semiconductor substrate (high-resistance semiconductor substrate) can exhibit a specific resistance (specific volume resistance) of at least 300 Ohm cm. Preferably, there is a specific resistance of at least 500 Ohm cm. The transition to intrinsic electrical conduction of the substrate material may provide an upper limit of high resistance.

Aside from the above, one or more additional doping regions are provided in the semiconductor substrate to go along with the usual doping regions. They form additional doping zones in the semiconductor substrate, and make it possible to provide functions of the previously low-resistance semiconductor substrate. In particular, a precise adjustment of the operating point is supported. The at least one additional doping region, which is allocated to one or more of the doping regions, is used for decoupling from the construction of charge carrier depletion zones required in the overall semiconductor structure, and from the adjustment of the barrier heights required for operation. The provision of one or more additional doping regions yields an additional degree of freedom when designing the semiconductor structure, so that operating points can also be set here, for example, to offset layer thickness fluctuations of used epitaxial substrates.

The at least one additional doping region may be formed on a side of the doping regions facing the cover layer and/or a side facing the substrate. In the case of the doping regions designed as a planar arrangement, this makes it possible to situate the at least one additional doping region below and/or above the planar arrangement. It can also be provided that the at least one additional doping region in the planar arrangement of the doping regions in the semiconductor substrate extend in one or more intermediate areas between adjacent doping regions. In the formation of the at least one additional doping region on the side of the doping regions facing the cover layer, the at least one additional doping region is preferably situated in an area of the semiconductor substrate between the cover layer and the doping regions. When the at least one additional doping region is provided on the side of the doping regions facing the substrate, the at least one additional doping region is preferably situated in an area of the semiconductor substrate between the doping regions and the substrate.

The at least one additional doping region may be formed while physically contacting (being provided in contact with) the allocated or assigned doping region(s). The physical contact can be planar in design. It can be provided that the at least one additional doping region overlap the allocated doping region in one area, and also extend up until into an intermediate area between the doping regions.

In an overlapping area in which the at least one additional doping region overlaps the allocated or assigned doping region(s), the at least one additional doping region may be provided with a layer thickness that differs from a layer thickness of the at least one further doping region outside of the overlapping area. When using the semiconductor structure in the radiation detector, the overlap arises in a viewing direction on the photoactive surface of the radiation detector formed with the aid of the semiconductor structure. The layer thickness indications relate to an extension transverse to the planar extension of the doping regions.

The layer thickness in the overlapping area may be less than outside the overlapping area for the at least one additional of further doping region.

The at least one additional doping region may be provided as a coherent doping region for several of the doping regions. In one embodiment, the at least one additional doping region is fabricated as a continuous layer. These or other embodiments can optionally be formed without the use of masking while depositing the semiconductor materials during production.

The at least one additional doping region may flatly overlap with one of the doping regions, and an essentially continuously uniform overhang may be formed around the overlapping surface, in which the at least one additional doping region laterally projects relative to one of the doping regions. In the viewing direction on the planar arrangement of doping regions, this means that the at least one additional doping region completely covers the allocated doping region, and projects continuously to the same extent.

At least sections of the at least one additional doping region may be provided with the same layer thickness as the allocated or assigned doping region(s). The layer thickness indication again relates to an extension transverse to the planar arrangement of the doping regions.

One or more additional upper doping regions may be formed in an area of the semiconductor substrate between the cover layer and the doping regions, and the one or more additional upper doping regions may limit avalanche area away from the cover layer toward the doping regions in the semiconductor substrate. By the one or more additional upper doping regions the extension of the avalanche area away from the cover layer toward the doping regions may be limited in the semiconductor substrate. The avalanche area establishes a reproduction region, in which free charge carriers reproduce as the result of collisions after the incident light to be detected has been absorbed. This takes place in the high field strength area (high field). The one or more additional upper doping regions may help make it possible to individually configure the avalanche area.

One or more additional lower doping regions may be formed in an area of the semiconductor substrate between the substrate and the doping regions, and the one or more additional lower doping regions may limit the extension of the quenching area away from the doping regions toward the substrate in the semiconductor substrate. By the one or more additional lower doping regions the extension of the quenching area away from the doping regions toward the substrate may be limited in the semiconductor substrate. The quenching area is used to again quench the avalanche effect that had previously taken place, so as to quickly enable the detection of subsequent photons ("quenching"). The one or more additional lower doping regions may be used to individually configure the quenching area in the semiconductor substrate.

BRIEF DESCRIPTION

Additional aspects of the disclosure will be explained below, in particular drawing reference to embodiments as well. Reference is made to the figures in a drawing. Shown on:

DETAILED DESCRIPTION

One exemplary embodiment proceeds from an n-conductivity type of material for a semiconductor substrate. However, the aspects of the disclosure can also be applied without limitation to p-conductivity type substrates. In this case, the indicated conductivity types must be cyclically switched.

Figure 1:
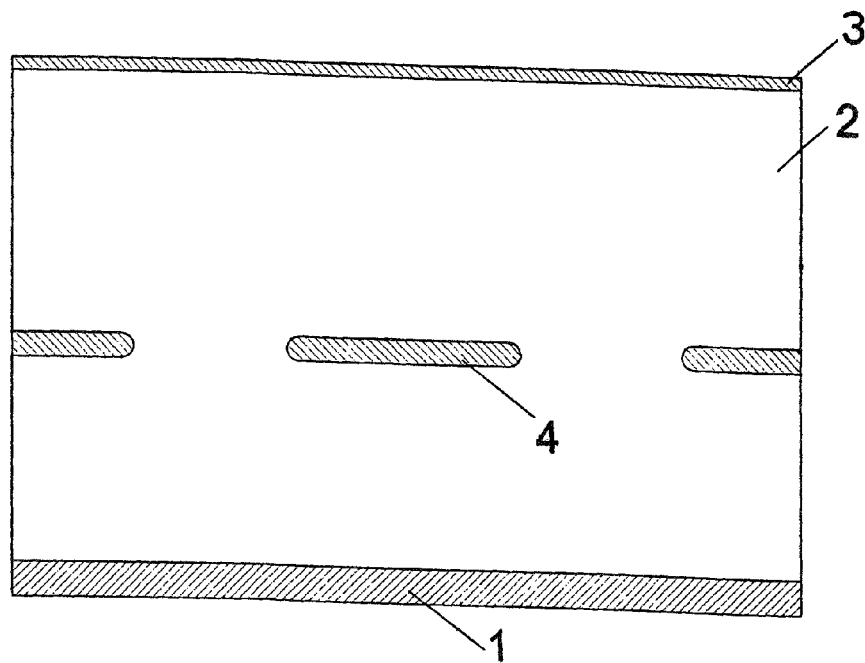
FIG. 1 is a schematic view of an arrangement of a known semiconductor detector.

FIG. 1 shows a schematic view of a known semiconductor detector. A low-resistance p-type semiconductor substrate 2 with an n-conductivity type top diode 3 is arranged on a very low-resistance n-type epitaxial substrate 1. Located in roughly the middle of this arrangement are n-type doping zones 4, which are completely isolated and "float". Only a small section with three of the doping zones 4 are depicted here. However, real components can exhibit thousands of them, arranged as a matrix or also in hexagonal fields. Disadvantages here include the large operating point voltages for completely depleting the low-resistance layers, and of course the large capacitances of the "floating" structures associated with this low resistance. These capacitances significantly limit the potential swing required for operation, so that only very small pixels with a then sufficiently small capacitance can even be made to function at all. This is connected with the disadvantages described at the outset with respect to the pixel-to-gap area surface ratio, and hence to the quantum yield, and of course the "afterpulsing" also associated with the small dimensions and here very strongly in evidence and the "pseudoafterpulsings" based on the incorrect material selected for the semiconductor substrate 6. This phenomenon of "pseudoafterpulsings" in such a structure will be explained once again in detail at the end of the following arrangement.

Figure 2:
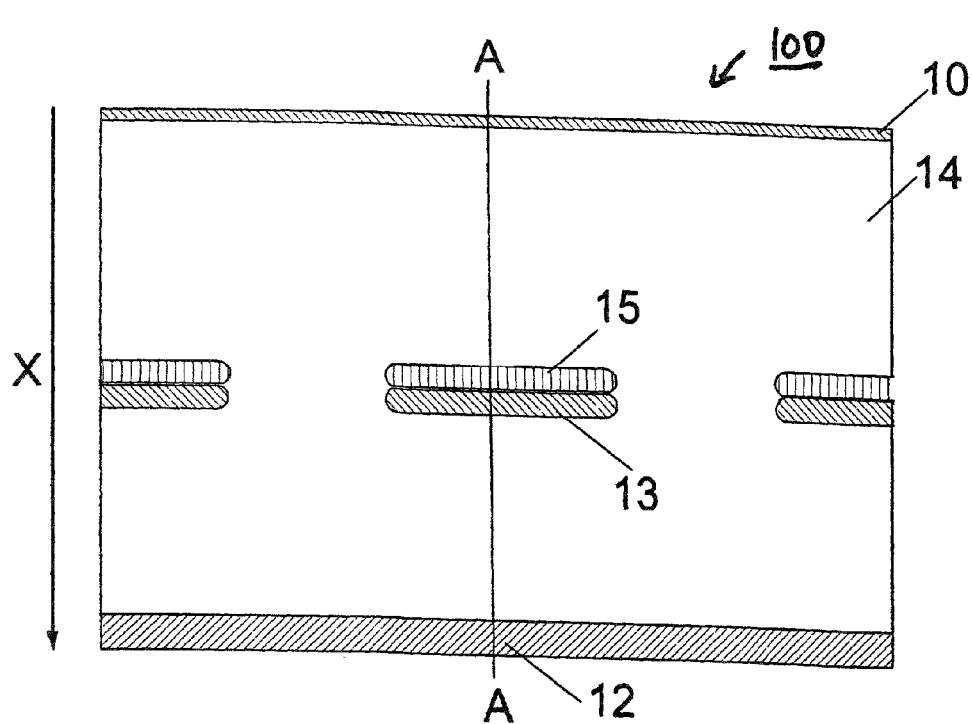
FIG. 2 is a schematic, sectional view of a semiconductor structure, wherein the doping regions are accompanied by additional doping regions allocated thereto in a semiconductor substrate.

FIG. 2 shows a schematic, sectional view of a semiconductor structure 100, wherein the doping regions 13 are combined with additional doping regions 15 allocated thereto in a semiconductor substrate 14. In the semiconductor structure 100, a high-resistance, n-doped semiconductor layer forms the semiconductor substrate 14. The semiconductor layer preferably exhibits 300 Ohm cm or even higher values. The operating point of the semiconductor structure 100 is set when using the latter in a radiation detector by means of the additional doping zone 15, which is of the n-conductivity type, and hence exhibits the same conductivity type as the semiconductor substrate 14, while having a distinctly higher doping concentration than the semiconductor substrate 14.

The semiconductor substrate 14 is here grown as an epitaxial layer on a very low-resistance, n-conductivity type substrate 12. In this configuration, the substrate 12 forms an epitaxial substrate. The doping regions 13 designed as floating areas are of the p-conductivity type, and during operation never experience a complete depletion of charge carriers. This is in contrast with the additional doping regions 15, in which the charge carriers can become completely depleted. The semiconductor structure 100 is covered by a p-type cover layer 10, which together with the adjacent semiconductor substrate 14 forms a pn-transition for a top diode. A reverse voltage is applied between the cover layer 10 and substrate 12 for operating the semiconductor structure 100 as a radiation detector.

Figure 3:
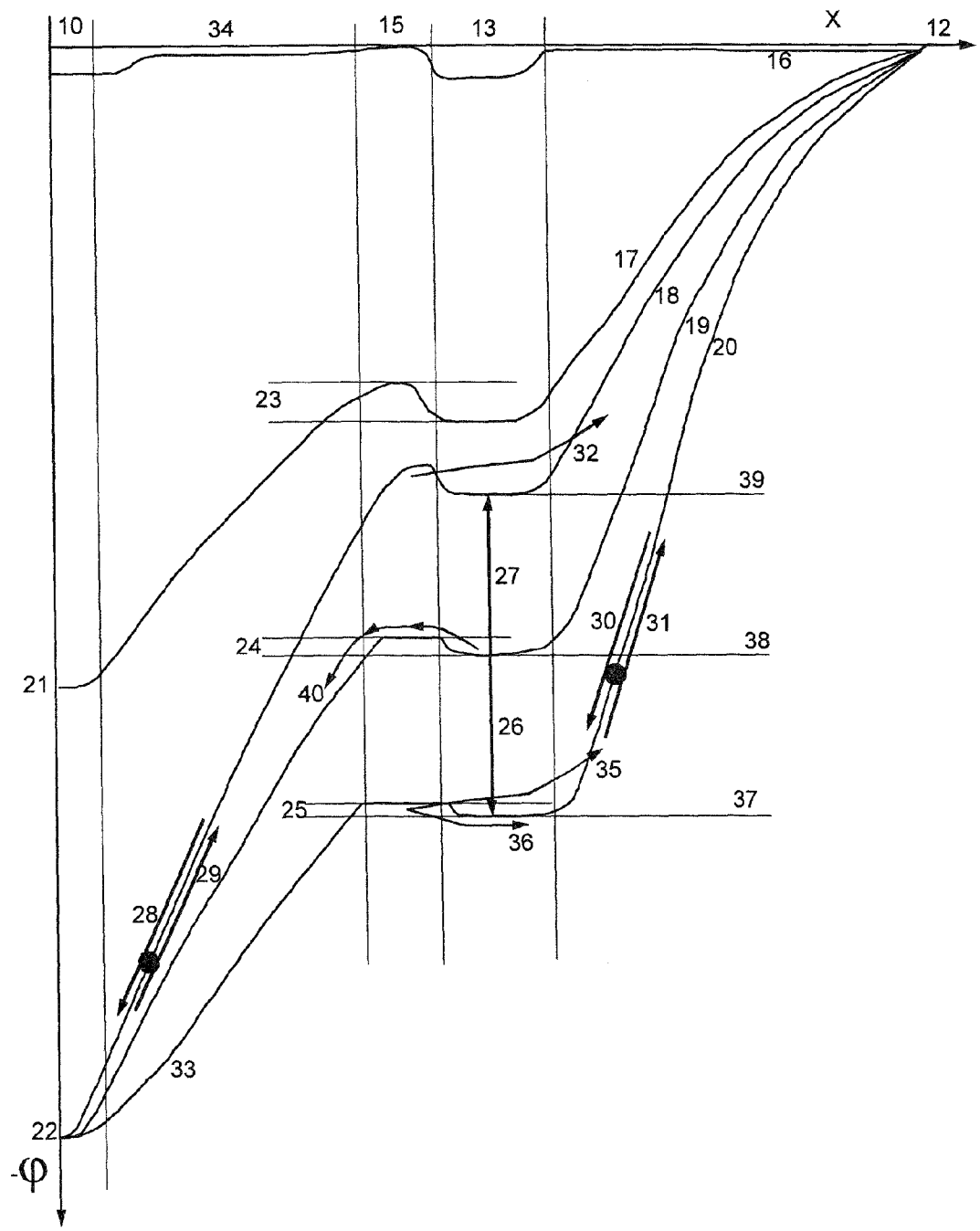
FIG. 3 is a schematic view of potentials along a line AA in the semiconductor structure on FIG. 2.

FIG. 3 shows a schematic view of potentials along a line AA in the semiconductor structure 100 on FIG. 2. Curve 16 shows the potential at thermodynamic equilibrium which essentially images the static diffusion potentials.

The regions as divided into the various crystal depths are labeled above that as follows: 10—cover layer (top diode), which here serves as a charge collector and control electrode; 15—additional doping region, which is referred to as the base region of the avalanche phototransistor; 13—the floating, non-depleting doping region, which here serves as a hole charge emitter not directly connected to a potential; and 12—the counter electrode of the substrate.

If a potential 21 is applied to the top diode formed by the cover layer 10 in relation to the substrate 12, the potential progression changes according to curve 17. An electrical field is built up in the area above and below the floating emitter, and hole charges flow off against the top diode via the potential barrier 23 set with the additional doping zone 15.

The very small dark currents required for single photon detection have only a very few electrons flowing into the additional doping zone 15 forming a base region, which can always flow off toward the substrate 12 due the absence of the lateral barrier. As a result, the additional doping zone 15 here remains practically free of any charge, and the potential barrier 23 arises as the result of the Fermi-Boltzmann statistics of the hole charges in the doping region 13, which forms an emitter region for these hole charge carriers. Of course, this also encompasses hole charges of the dark current, which are generated in the lower area located in the direction toward the substrate 12, and flow into the doping region 13 (emitter region).

In order to reach the actual operating point of the structure, the potential of the top diode is increased to the value 22.

The curve 18 shows the corresponding progression for the potential. It turns out that the electrical field strength in the upper area near the cover layer 10 (top diode) exceeds the field strength required for an avalanche breakthrough. A single trigger event, for example a single irradiated photon, here sets off an avalanche breakthrough. Both types of charge carriers are here generated, i.e., electrons and holes. The arising holes are influenced by the field to move in the direction of arrow 28 until into the area of the top diode, which incorporates them. The arising electrons move in the direction of arrow 29, and are initially accumulated in the additional doping zone 15 (base area). This process is very fast, and lasts only a few picoseconds.

The electron charges located in the base area cause the potential barrier formed there to degrade, and their presence shifts the potential there in a negative direction. As a result, the potential in the doping zone 13 (emitter region) decreases from the value 39 to the value marked 38 on FIG. 3.

In addition, the degraded potential barriers 24 now induce hole charges to start flowing from the area of the doping zone 13 toward the top diode. This process is denoted by arrow 40, and the accompanying potential progression is depicted on FIG. 3 by curve 19. The loss in hole charges causes the potential of the emitter region to drop further to the value 37. As a consequence, the potential continues to shift as denoted in curve 20. This process is also very fast, and at low collector run times, the charge carriers also reach the top diode within the span of a few picoseconds.

It turns out that the breakthrough field strength formerly present in the front area has now disappeared. This process is referred to as "quenching" (quenching), and the avalanche breakthrough in the upper area of the semiconductor structure 100 is thus completed.

At the same time, however, the geometric dimensioning in the area behind the doping zone 13 (emitter region) has produced a field strength that can lead to an avalanche breakthrough. However, this only happens if charge carriers that trigger such a breakthrough do in fact exist there. In dark conditions, something of this nature occurs extremely rarely. A major proportion of the electron charges in the base area recombines due to the hole charges that flowed through there. The remaining portions of electrons stored there now flow in part into the emitter region (doping zone 13) via what is a very low barrier, and will recombine there at the latest, arrow 36 on FIG. 3.

However, a very small residual portion of these electron charges very slowly flows off laterally via the buried MOS channel present there and operated in the pinch-off area. In light of the high resistance of this channel, this process can last several hundred nanoseconds or even microseconds. This process is marked with arrow 35 on FIG. 3. Since already the first per mill of these residual charges flowing off to the side of the doping zone 13 get into the very high electrical field there, a few picoseconds are now also sufficient for the avalanche breakthrough in area 30, 31 that immediately takes place there to replace the hole charges that had previously flowed off in the top diode, thereby shifting the potential until into an area 39, as depicted on curve 18.

Therefore, the semiconductor structure 100 in the front area (upper area below the cover layer 10) is again switched into the Geiger mode after a very short time already, regardless of how long the actual lateral discharging of electron charges might still last. This continued outflow of electron charges is now no longer associated with an avalanche amplification for the electron charges flowing on to the substrate 12, and the hole influx into the floating emitter region stops here in a self-limiting manner precisely once the field strength critical for the avalanche effect is dropped below in the rear area.

Since the lulls between two single events relating to the same pixel are also big enough in the case of single photon detections for many thousand pixels, the continued discharging of these electron charges also poses no major problem in terms of the operating point.

Figure 4:
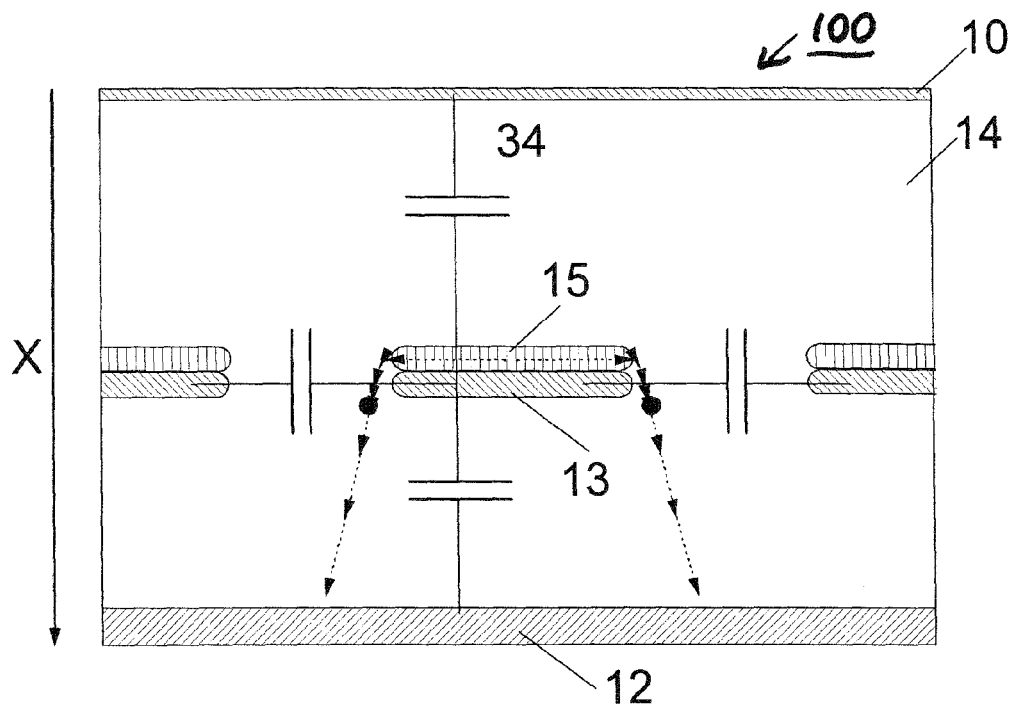
FIG. 4 is a schematic, sectional view of the semiconductor structure on FIG. 2, wherein the capacitance of a doping zone is depicted.

Among other things, the exact scope of the potential swing between the upper potential 39 and lower potential 37 depends on the dimensioning of the additional doping zone 15 and the resultantly set potential barrier 23, as well as the overall capacitance of all four partial capacitances depicted on FIG. 4 for the floating doping zone 13. FIG. 4 also depicts yet again the path of the electron charges from the additional doping zone 15 (base region) to the substrate 12. Dots are used to denote the approximate position of the zones with the highest field strength toward the substrate 12, in which parts of the electron charges are multiplied. The hole charges arising in the process flow directly back into the emitter region (doping zone 13), and thereby reset the operating point.

Figure 5:
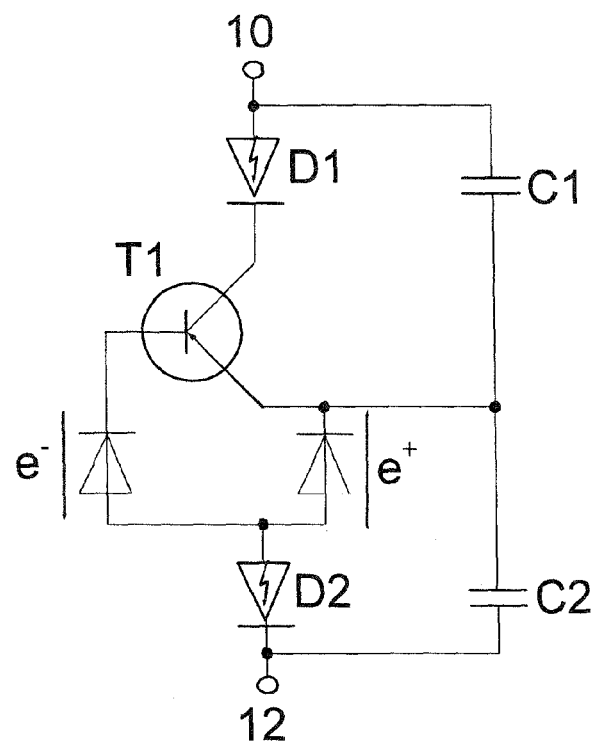
FIG. 5 is a simplified equivalent circuit diagram depicting the structure of a pixel.

The equivalent circuit diagram on FIG. 5 has thus only been simplified, since existing coupling capacitances to the adjacent pixels have here been omitted to simplify the depiction. On FIG. 5, D1 denotes the avalanche diode in the upper part of the semiconductor structure 100 of a pixel at position 34, D2 denotes the avalanche diode in the lower part of the semiconductor structure 100 of a pixel, while C1 and C2 denote the capacitances to the "floating" emitter of the bipolar transistor T1. The dashed diode structures are not actually present, and are here intended just to indicate that the avalanche diode D2 is first supplied by the electron charges e- flowing from the base of the transistor T1, and the hole charges e+ arising there through avalanche multiplication flow into the emitter region.

Figure 6:
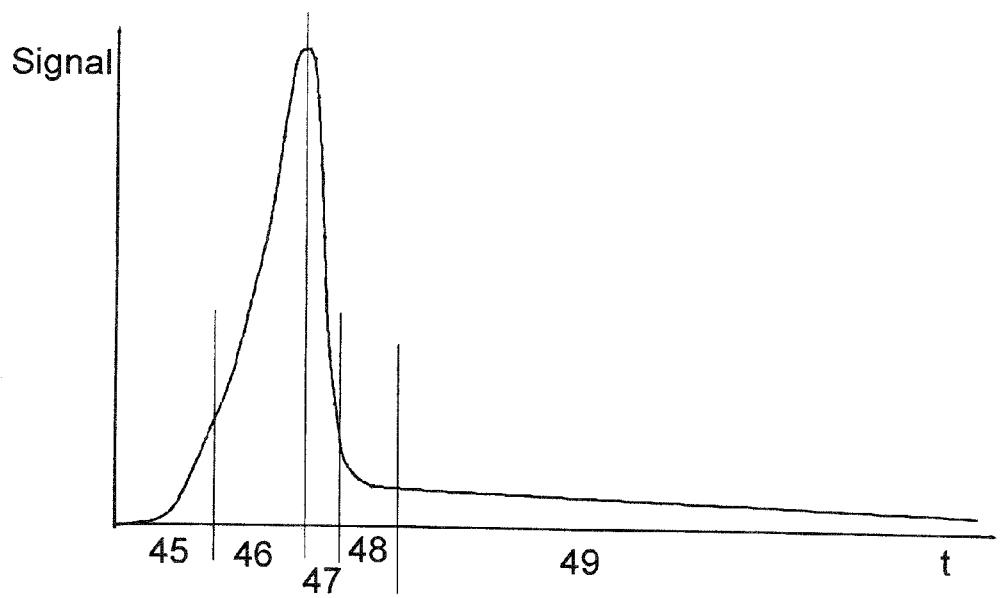
FIG. 6 is a schematic view of time sequences.

FIG. 6 shows a schematic view of time sequences in conjunction with the processes in the semiconductor structure 100 described above.

In the starting range 45, a single photon is absorbed in the upper avalanche diode D1, and an avalanche multiplication begins. During this phase, 25,000 to 100,000 charge carriers of both types are typically generated, since the electrical field strength is there greater at this point in time than the field strength required for the avalanche breakthrough. These charge carriers are separated from the field. The hole charges flow into the top diode, the electron charges into the additional doping region 15 (base region). This happens within a few picoseconds. In the base region, the potential of the barrier between the additional doping region 15 and the floating doping region 13 (emitter region) is thereupon diminished, and additional hole charges stored on the capacitances C1, C2 begin to flow toward the top diode formed with the cover layer 10. This can be noted in the region 46 as a rise in current. The total number of charge carriers that flow here depends on the current amplification of the bipolar structure, and measures between 10 . . . 100 . . . 1000. The high hole loss of the doping region 13 causes the potential of this region to drop so far that the avalanche process in D1 comes to a standstill. In addition, a large proportion of the electron charges generated through multiplication will here recombine in the base region 15. This process is also very fast, and requires only a few additional picoseconds.

The loss in electron charges makes the barrier between the additional doping region 15 and the doping region 13 larger, and the current flow to the top diode collapses, as depicted in the region 47. The additional doping region 15 (base) now has only a relatively few electron charges, which can only flow off on the side of a pixel. The first electron charges there flowing off toward the substrate 12 now start the second avalanche process in the lower diode D2. This process is also very fast, and within time domain 48 renews the hole charge to the emitter capacitances C1, C2, thereby returning the entire structure to the Geiger mode of the upper avalanche diode D1 ready to receive photons. Only a very few electrons still remain in the additional doping region 15 thereafter in time domain 59, and flow out of this "buried channel" region operated in the pinch-off area against the substrate 12 in distinctly longer periods of time that can lie in the microsecond range, during which they are multiplied just a little or not at all, since a high enough electrical field to allow significant multiplication of the charge carriers no longer exists here given the return to the Geiger mode of the upper region 34.

As a result of this mechanism, precisely as many hole charges are generated in diode D2 on average as to switch the emitter region to the upper operating point, curve 18. On average here only means that there can be more one time, and fewer another. If there are fewer, only the operating point for the potential shifts slightly. But if there are more, the excess charge carriers flow off toward the top diode. However, since the barrier height sets in as the diffusion potential via charge carrier diffusion from the doping region 13 toward the top diode, the used charge carrier type cannot be changed out.

There is less of a probability that hole charges in silicon will trigger an avalanche than electron charges, typically by a factor of k=0.002. If reversed conductivities are here used for this structure, i.e., p-type semiconductors as the epitaxial layer and n-type semiconductors for the "floating" emitter, the barrier height is set via the outflow of electrons to what is then an n-type top diode. It is then very highly probable that these electrons will cause another avalanche breakthrough, which will erroneously be attributed to imaginary, radiating photons from the adjacent pixels as "afterpulsing". However, this case only involves "pseudoafterpulsing" brought about by this incorrect material selection and based on the process described above for restoring the operating point via electron diffusion over the barrier. As a result, preferably the "floating" emitter and top diode are always of the p-conductivity type, and the high-resistance semiconductor layer enveloping it along with the additional doping region 15 should be of the n-type, if silicon is chosen as the raw material.

Figure 7:
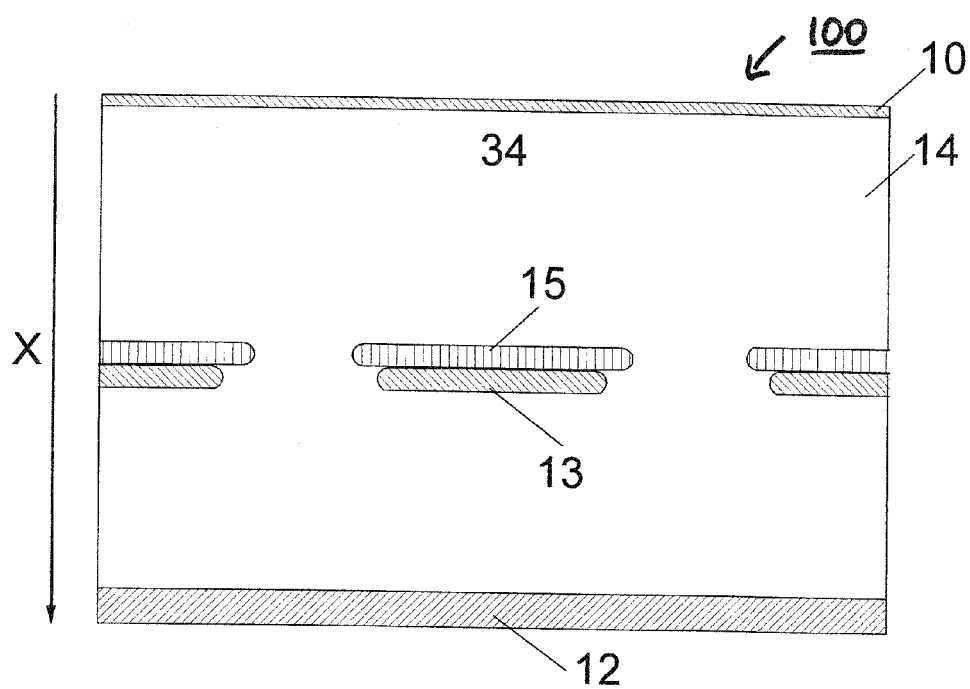
FIG. 7 is a schematic, sectional view of a semiconductor structure, wherein an exemplary embodiment is depicted for a lateral expansion of the additional doping regions.
Figure 8:
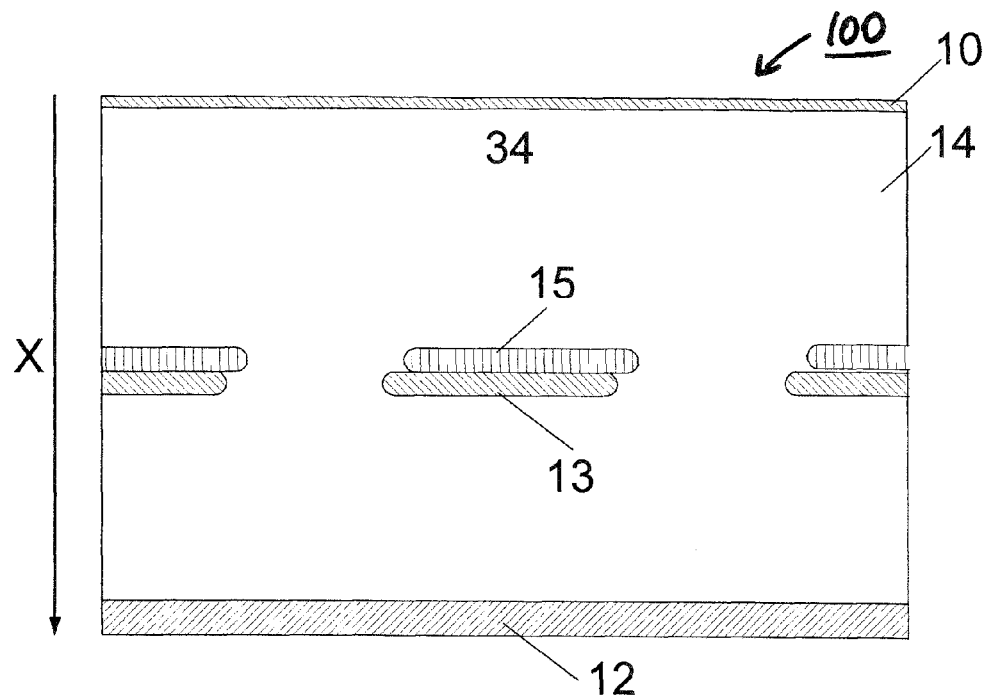
FIG. 8 is a schematic, sectional view of a semiconductor structure, wherein a different exemplary embodiment is depicted for a lateral expansion of the additional doping regions.

FIGS. 7 and 8 each show a schematic, sectional view of a semiconductor structure 100, wherein exemplary embodiments are depicted for various lateral expansions of the additional doping regions 15.

Figure 9:
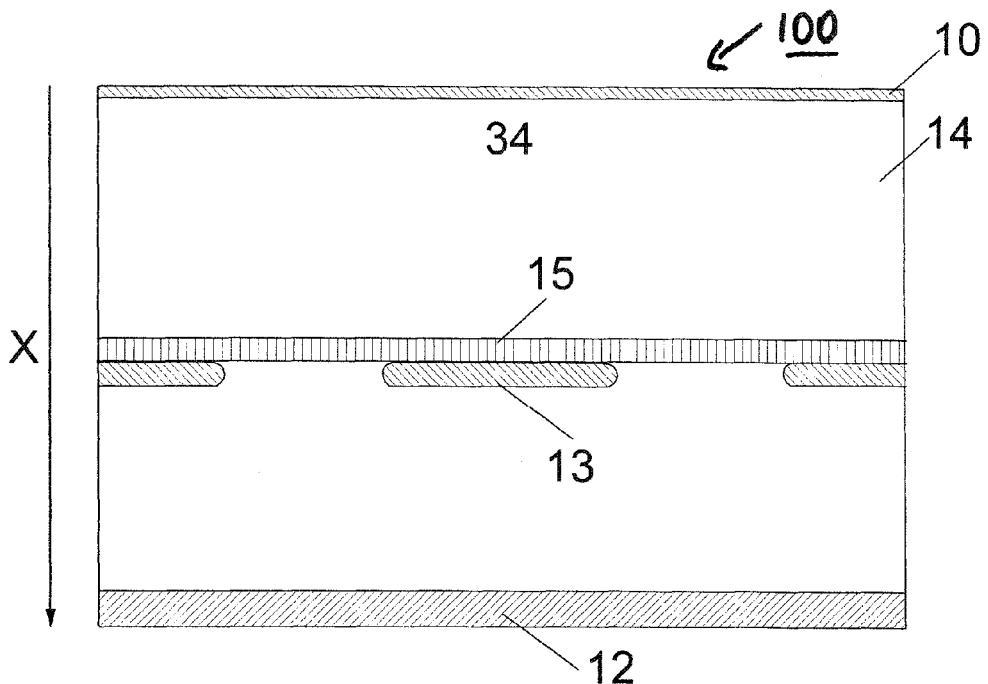
FIG. 9 is a schematic, sectional view of a semiconductor structure, wherein another exemplary embodiment is depicted for a lateral expansion of the additional doping regions.

A problem that may first arise when using high-resistance semiconductor substrates 14 can be prevented with the configuration shown on FIG. 9. Given large potential swings of the "floating" emitter regions (doping region 13) of the kind that are depicted on FIG. 3 with 26 and 27, and necessary for operation, there may thus be problems in which the potential barriers realized exclusively by the low doping in the gap regions for hole charges between two directly adjacent emitter regions (doping regions 13) are degraded to such an extent that hole charges between the latter start to flow. This can be effectively prevented by a whole-surface additional doping zone 15 in the entire pixel region.

Figure 10:
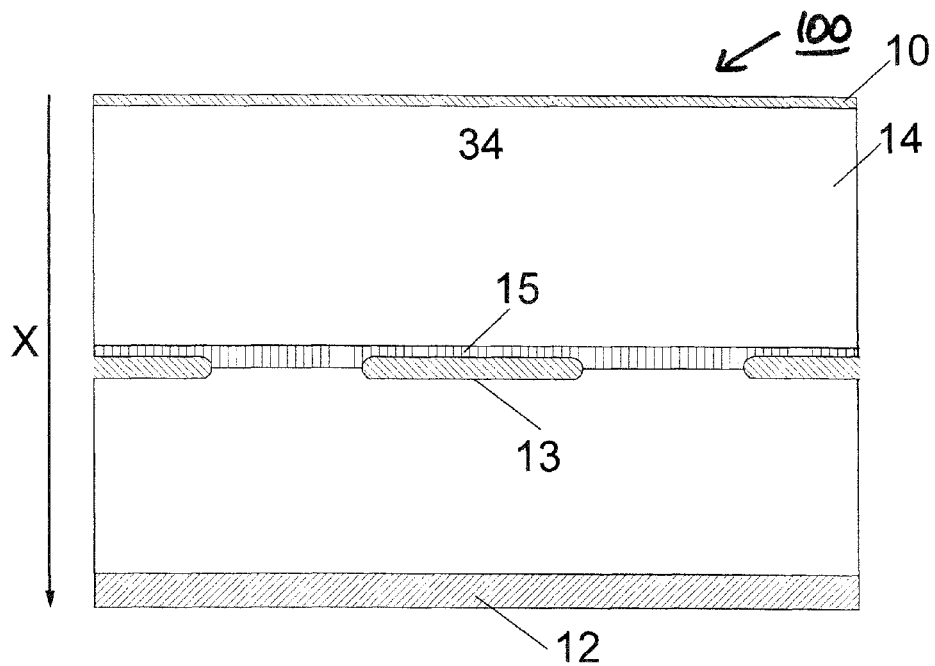
FIG. 10 is a schematic, sectional view of a semiconductor structure, wherein yet another exemplary embodiment is depicted for a lateral expansion of the additional doping regions.

The shifted implantation depth of the additional doping zone 15 depicted on FIG. 10 enables an operating point adjustment of the doping concentrations. Since parts of the n-type doping of the additional doping zone 15 are compensated by the significantly more concentrated p-type doping of the doping region 13 in the region lying directly above the emitter regions 13, it is possible to realize a smaller doping concentration there than in the gap regions. As a result, a sufficient potential barrier is set in the base region on the one hand, and the potential barrier for separating directly adjacent emitter regions in the gap regions is strengthened on the other.

Figure 11:
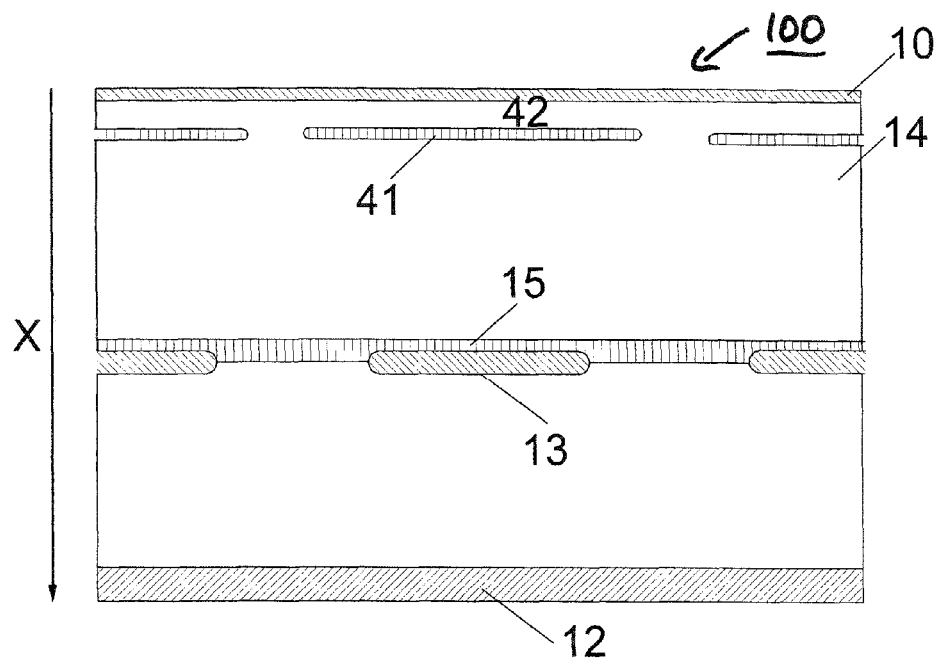
FIG. 11 is a schematic view of a semiconductor structure with additional upper doping regions.

FIG. 11 shows a schematic view of a semiconductor structure 100 with additional upper doping regions 41. The additional upper doping regions 41 limit the high field strength area (high field, avalanche area) to a region 42 below the cover layer 10. This enables systematically smaller operating voltages for the semiconductor structure 100.

Figure 12:
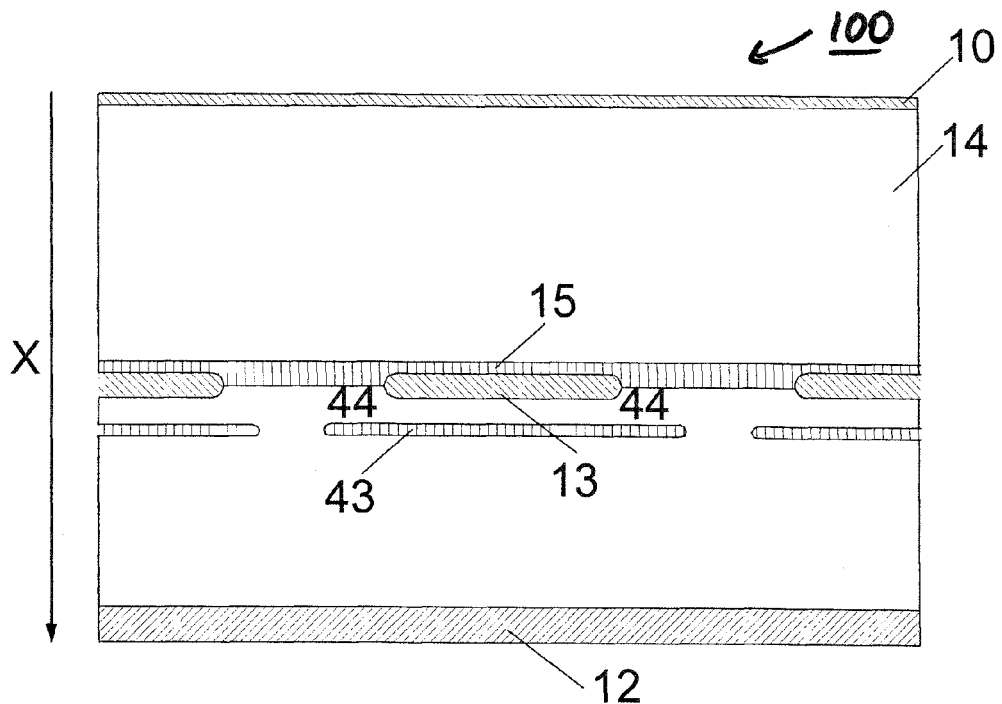
FIG. 12 is a schematic view of a semiconductor structure with additional lower doping regions.

FIG. 12 shows a schematic view of a semiconductor structure 100 with additional lower doping regions 43. The additional lower doping regions 43 limit the quenching area ("quenching") to a region 44 below the doping regions 13.

Figure 13:
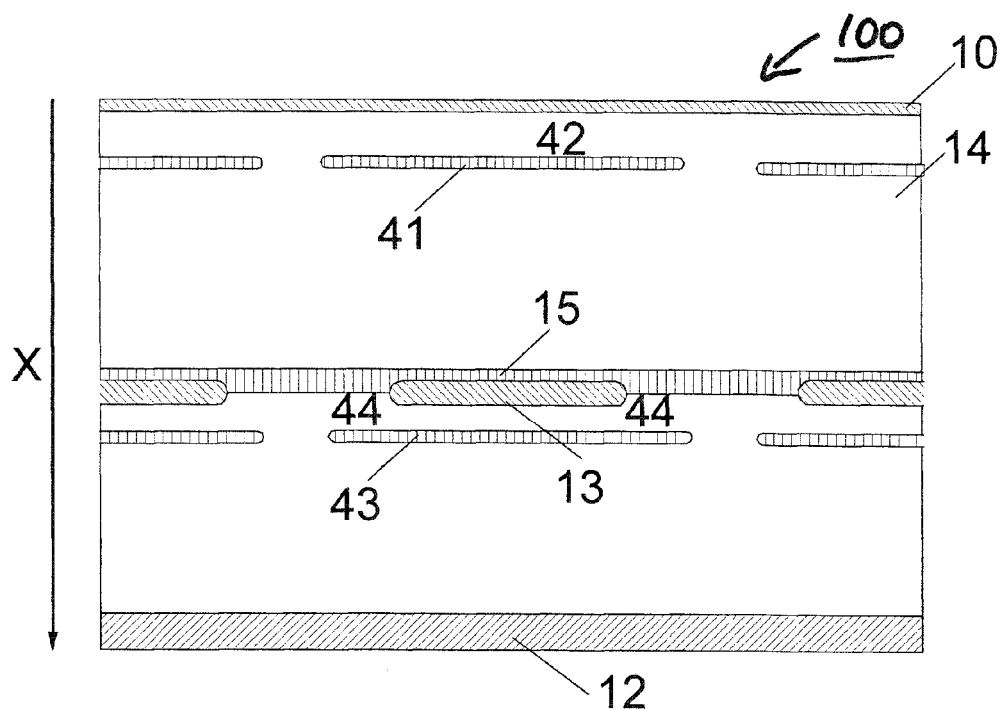
FIG. 13 is a schematic view of a semiconductor structure with additional upper and lower doping regions.

FIG. 13 shows a schematic view of a semiconductor structure 100 with additional upper and lower doping regions 41, 43. The structure depicted on FIG. 11 is here additionally used in proximity to the surface. This yields two series-connected avalanche structures, which are coupled with each other by means of a bipolar transistor construction with floating emitter.

As a whole, the objective is often to configure the pixel geometries to be larger, so as to limit the problems associated with "afterpulsing". Smaller structural capacitances are required for this purpose. However, if the overall layer thicknesses between the cover layer 10 and substrate 12 do be depleted become rather large, problems can arise in which the avalanche field in the lower portion of the structure necessary for resetting the potential can only be achieved with difficulty. For this reason, the avalanche area can here also be limited to the regions marked 44 by means of the n-type doping zone 43. This further lowers the total required operating point voltage.

In conclusion, the second possible case involving the passive quenching ("quenching") of such a structure, which is presumably also frequently encountered in practice, will be explained.

This case is always encountered at exactly the point at which the electrical field below the doping regions 13 cannot become strong enough to achieve an avalanche breakthrough there. This is possible for geometric reasons, for example when the distance between the "floating" doping regions 13 and the lower counter-electrode formed by the substrate 12 gets rather large. In this case, the potential differences between adjacent floating regions can become so large that a charge carrier current, in this instances of holes, arises between them. The associated MOS volume channel(s) with charge carriers are always nearly in the pinch-off area, and thus have a rather high resistance overall. For this reason, this is depicted symbolically with resistors on FIG. 14, but here only in one dimension. The "floating" regions here form a planar, two-dimensional matrix or, in a hexagonal case, a network in which all respective adjacent pixel structures are coupled with each other at a high resistance.

Figure 14:
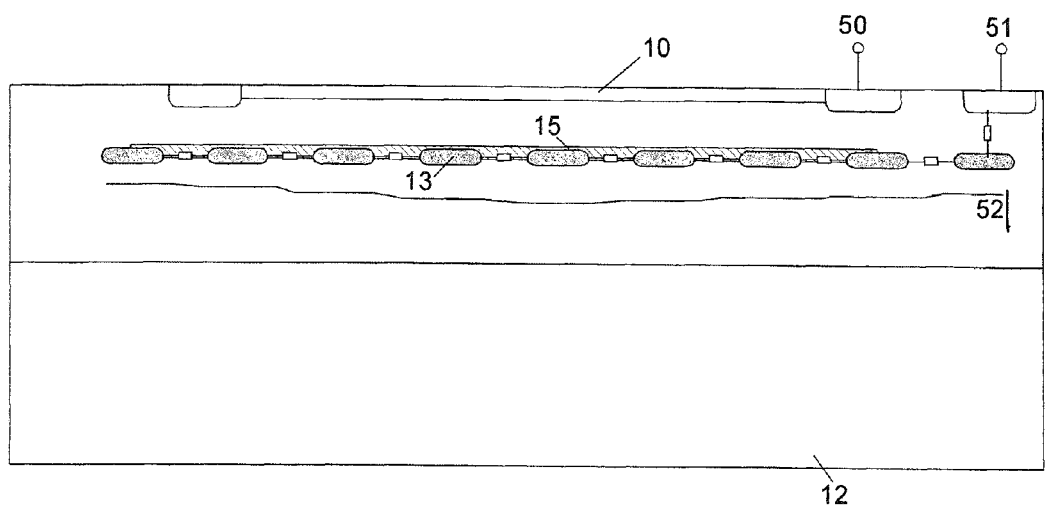
FIG. 14 is a schematic view of a semiconductor structure for a radiation detector in conjunction with passive quenching ("quenching").

In this case, it naturally happens that the structures lying in the middle of a detector form another operating point potential 52 than the ones lying in the edge areas as depicted on FIG. 14. Especially since layout steps in the edge area can be taken to ensure that the external pixels remain on a specific potential level, operating point port 51. Of course, this type of quenching is a great deal slower than the active structure with bipolar transistor described above owing to its passive nature and the high resistance of the connections.

It can also be provided that the potential in the central area of the structure be large enough to use the avalanche effect of the D2 diode for resetting purposes, but not in the edge areas of the same detector due to the high-resistance coupling of the hole charges at the edge areas. This is because the high potentials necessary to this end are there hardly reached. As a consequence, the very rapid times for the active resetting in the central area naturally become mingled with the distinctly slower times for the edge areas.

A new type of semiconductor was introduced that describes the coupling of avalanche areas with the construction of a bipolar transistor. This yields a very fast, active "quenching" in each individual pixel.

The features of the disclosure outlined in the above description, drawing and claims can be of importance both separately and in any combination for realizing the disclosure in its various embodiments.

REFERENCE LIST

1 Epitaxial substrate
2 Semiconductor substrate on the epitaxial substrate 1
3 Cover layer on the semiconductor substrate 2
4 Doping zone in the semiconductor substrate 2
10 Cover layer on the semiconductor substrate 14
12 Substrate
13 Doping zone/region in the semiconductor substrate 14
14 Semiconductor substrate on substrate 12
15 Additional doping zone/region in the semiconductor substrate 14
16 Potential progression curve at thermodynamic equilibrium
17 Potential progression curve without avalanche breakthrough
18 Potential progression curve with high field strength in the surface area
19 Potential progression curve after a trigger event
20 Potential progression curve in the "quenched" state
21 Surface potential on the top diode
22 Surface potential on the top diode
23 Height of the potential barrier in the base area
24 Height of the potential barrier in the base area with stored electron charges
24 Height of the potential barrier in the base area of a completely "quenched" structure
26 Potential swing of the emitter region caused by hole outflow
27 Potential swing of the emitter region caused by stored electron charges
28 Transport direction of hole charges and position of highest field strength
29 Transport direction of electron charges and position of highest field strength
30 Transport direction of hole charges and position of highest field strength
31 Transport direction of electron charges and position of highest field strength
32 Transport direction of electron charges laterally past the emitter region
33 Area of electrical field strength under the avalanche breakthrough
34 Collector run zone
35 Transport direction of electron charges laterally past the emitter region
36 Transport direction of electron charges into the emitter region
37 Lowest potential of the emitter region
38 Average potential of the emitter region
39 Highest potential of the emitter region
40 Transport direction of hole charges from the emitter region into the collector run region
41 Additional upper doping zone in the semiconductor substrate 14
42 Limited area of avalanche field strength in the semiconductor substrate 14
43 Additional lower doping zone in the semiconductor substrate 14
44 Limited area of avalanche field strength in the semiconductor substrate 14
454 Starting time domain
46 Bipolar strengthening, time domain
47 Avalanche "quenching" time domain
48 Structure reset time domain
49 Operating point restoration time domain
50 Top diode port
51 Operating point setting port, passive "quenching"
52 Potential loss curve for "floating" regions
100 Semiconductor structure

The invention claimed is:

1. A semiconductor structure for a radiation detector, comprising
   a substrate composed of a semiconductor material of a first conductivity type;
   a semiconductor substrate, wherein the semiconductor substrate is provided with a semiconductor layer provided on the substrate and having a higher resistance in comparison to the substrate, of the first conductivity type, and electrically doped with a doping concentration;
   a plurality of doped regions, wherein the plurality of doped regions are provided in the semiconductor substrate and separated from each other, of a second conductivity type that is opposite from the first conductivity type, and electrically doped with a doping concentration that is higher than the doping concentration in the semiconductor substrate;
   at least one further doping region, wherein the at least one further doping region is provided in the semiconductor substrate and assigned to one or more of the plurality of doping regions, of the first conductivity type, and electrically doped with a doping concentration that is higher than the doping concentration in the semiconductor substrate; and
   a cover layer that is provided on the semiconductor substrate and of the second conductivity type,
   wherein an avalanche area, which is an area of high electrical field strength, is provided in the semiconductor substrate between the plurality of doping regions provided herein and the cover layer provided on the semiconductor substrate, in which free charge carriers are replicated during operation due to collisions,
   wherein a quench area is provided in the semiconductor substrate between the plurality of doping regions provided herein and the substrate.

2. The semiconductor structure according to claim 1, wherein the at least one further doping region is provided on a side of the plurality of doping regions facing the cover layer and/or a side facing the substrate.

3. The semiconductor structure according to claim 1, wherein the at least one further doping region is provided in contact with one or more of the plurality of doping regions.

4. The semiconductor structure according to claim 1, wherein, in an overlapping area in which the at least one further doping region overlaps one or more of the plurality of doping regions, the at least one further doping region is provided with a layer thickness that differs from a layer thickness of the at least one further doping region outside of the overlapping area.

5. The semiconductor structure according to claim 4, wherein the layer thickness in the overlapping area is less than outside the overlapping area for the at least one further doping region.

6. The semiconductor structure according to claim 1, wherein the at least one further doping region is provided as a coherent doping region for a plurality of the plurality of doping regions.

7. The semiconductor structure according to claim 1, wherein the at least one further doping region flatly overlaps with one of the plurality of doping regions, and an essentially continuously uniform overhang is formed around the overlapping surface, in which the at least one further doping region laterally projects relative to one of the plurality of doping regions.

8. The semiconductor structure according to claim 1, wherein at least sections of the at least one further doping region is provided with the same layer thickness as the plurality of doping regions.

9. The semiconductor structure according to claim 1, wherein one or more additional upper doping regions are formed in an area of the semiconductor substrate between the cover layer and the plurality of doping regions, and wherein the one or more additional upper doping regions limit the avalanche area away from the cover layer toward the plurality of doping regions in the semiconductor substrate.

10. The semiconductor structure according to claim 1, wherein one or more lower doping regions are formed in an area of the semiconductor substrate between the substrate and the plurality of doping regions, and wherein the one or more lower doping regions limit the quenching area from the plurality of doping regions toward the substrate in the semiconductor substrate.

11. The semiconductor structure according to claim 1, wherein the semiconductor substrate is provided with a high resistance, with a specific resistance of at least 300 Ohm cm.

12. A radiation detector, comprising a semiconductor structure according to claim 1.

* * * * *